United States Patent
Nakayama et al.

(10) Patent No.: US 6,917,848 B1
(45) Date of Patent: Jul. 12, 2005

(54) PRODUCTION SYSTEM FOR PRINTED WIRING BOARD

(75) Inventors: Akitaka Nakayama, Kawasaki (JP); Akio Ikeda, Kawasaki (JP); Kiyoshi Hyodo, Kawasaki (JP); Kazuo Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 149 days.

(21) Appl. No.: 09/715,081

(22) Filed: Nov. 20, 2000

(30) Foreign Application Priority Data

Feb. 28, 2000 (JP) ........................................ 2000-051404

(51) Int. Cl.[7] ............................................. G06F 19/00
(52) U.S. Cl. ........................... 700/121; 700/95; 700/96; 700/99; 700/103; 700/106; 700/107; 700/219; 700/223; 700/224; 700/225; 700/227
(58) Field of Search .................. 700/95–107, 219–221, 700/223–227, 110, 121, 131–135, 181

(56) References Cited

U.S. PATENT DOCUMENTS

| | | | | |
|---|---|---|---|---|
| 4,706,187 A | * | 11/1987 | Arai et al. | 29/710 |
| 5,155,679 A | * | 10/1992 | Jain et al. | 700/101 |
| 5,235,508 A | * | 8/1993 | Lirov et al. | 700/99 |
| 5,262,954 A | * | 11/1993 | Fujino et al. | 700/112 |
| 5,321,885 A | * | 6/1994 | Hino et al. | 209/573 |
| 5,325,582 A | * | 7/1994 | Glaser et al. | 209/573 |
| 5,333,111 A | * | 7/1994 | Chaiken et al. | 382/111 |
| 5,757,661 A | * | 5/1998 | Surville | 702/155 |
| 5,815,398 A | * | 9/1998 | Dighe et al. | 700/217 |
| 5,946,663 A | * | 8/1999 | Tanaka et al. | 700/103 |
| 5,953,232 A | * | 9/1999 | Blaimschein | 700/171 |
| 6,044,361 A | * | 3/2000 | Kalagnanam et al. | 705/28 |
| 6,205,370 B1 | * | 3/2001 | Blaimschein et al. | 700/134 |
| 6,220,743 B1 | * | 4/2001 | Campestre et al. | 700/97 |
| 6,223,093 B1 | * | 4/2001 | Kitamura | 700/104 |
| 6,295,728 B1 | * | 10/2001 | Shin et al. | 198/339.1 |
| 6,298,275 B1 | * | 10/2001 | Herman, Jr. | 700/130 |
| 6,434,444 B2 | * | 8/2002 | Herman, Jr. | 700/135 |
| 6,463,352 B1 | * | 10/2002 | Tadokoro et al. | 700/169 |
| 6,470,228 B1 | * | 10/2002 | Turner et al. | 700/97 |
| 6,487,473 B1 | * | 11/2002 | Beck et al. | 700/134 |
| 6,580,963 B2 | * | 6/2003 | Susnjara | 700/171 |
| 6,614,458 B1 | * | 9/2003 | Lambert et al. | 345/856 |
| 6,675,059 B2 | * | 1/2004 | Scott | 700/166 |

FOREIGN PATENT DOCUMENTS

| | | |
|---|---|---|
| JP | 6-318773 | 11/1994 |
| JP | 7-285018 | 10/1995 |
| JP | 8-11040 | 1/1996 |
| JP | 8-297503 | 11/1996 |
| JP | 11-10491 | 1/1999 |

* cited by examiner

*Primary Examiner*—Donald P. Walsh
*Assistant Examiner*—Jeffrey A. Shapiro
(74) *Attorney, Agent, or Firm*—Westerman, Hattori, Daniels & Adrian, LLP

(57) ABSTRACT

A manufacturing system for printed wiring boards divides printed wiring boards scheduled to be manufactured into non-fractional and fractional groups depending on the content of an order remainder list. The printed wiring boards categorized as non-fractional are panelized having the same shapes while the printed wiring boards categorized as fractional are grouped corresponding to manufacturing conditions thereof. Then, each group of the printed wiring boards are panelized with different shapes in a predetermined manufacturing block. Consequently, the generation of incidental products or the waste of material can be prevented.

10 Claims, 11 Drawing Sheets

PREDETERMINED MANUFACTURING BLOCK

E320-1234-T567/01

PANELIZING FOR THE SAME SHAPE

PANELIZING LAYOUT FOR DIFFERENT TYPES

ORDER REMAINDER LIST /36

| No. | DRAWING NUMBER | MANUFACT-URING QUANTITY | ORDER RECEPTION DATE | SHIPMENT DATE | REMARKS |
|---|---|---|---|---|---|
| 1 | E320-1234-T567/01 | 1 | 99.09.09 | 99.10.12 | REPRODUCTION BECAUSE OF DEFECT |
| 2 | E320-1234-T567/01 | 9 | 99.10.01 | 99.10.12 | |
| . | . | . | . | . | |
| . | . | . | . | . | |

GROUPX₁

PREDETERMINED MANUFACTURING BLOCK
※ " A " TO " N " ARE FINAL PRODUCTS

GROUPX₂

PREDETERMINED MANUFACTURING BLOCK
※ " A " TO " E " ARE FINAL PRODUCTS

⋮

GROUPXn

PREDETERMINED MANUFACTURING BLOCK
※ " A " TO " U " ARE FINAL PRODUCTS

PRODUCTION SYSTEM FOR PRINTED WIRING BOARD

BACKGROUND OF THE INVENTION

1. Field of the Invention

The present invention relates to a production system for printed wiring boards.

2. Description of the Related Art

Conventionally, printed wiring boards have been produced generally in the following manner. A substrate material in which a conductive film is formed on the surface of an insulated plate thereof (called "raw material") is prepared. A circuit pattern, solder resist and the like are formed on the raw material. After that, the excess portion of the raw material is cut off and removed and then the final product, printed wiring boards, is obtained.

The size and shape of the raw material is determined to be a specific size and a specific shape, and it is known as a "predetermined manufacturing block." A manufacturer of printed wiring boards determines the layout for the final product of printed wiring boards on that predetermined manufacturing block. This work is called "panelizing."

During panelizing, according to the dimensions of the predetermined manufacturing block, the positions of a circuit pattern, solder resist and the like to be formed on the material and the cutting lines on the material for the final product and the like are determined.

The result of the panelizing is reflected on a group of printed wiring boards. According to the panelizing result, for example, an art work film for forming etching resist and solder resist for forming a circuit pattern is created and then, the setting for forming the circuit or solder resist is carried out in respective units for use in a circuit forming process and a solder resist forming process by using the created art work film. Further, setting for an operation based on the result of the panelizing is carried out in a unit for drilling the raw material, a punching unit, and a cutting unit. If an instruction for manufacturing a printed wiring board (the instruction being called a "charge") is given to a group of manufacturing units for use in the manufacturing process, the respective units execute manufacturing processes according to the result of the panelizing.

If a large number of printed wiring boards are intended to be produced, a plurality of the printed wiring boards of the same kind are panelized in the predetermined manufacturing block in order to reduce the unused remaining portion of the raw material and to obtain as large a number of the printed wiring boards as possible from the predetermined manufacturing block (for panelizing for the same kind of printed wiring boards).

As a special case, if multiple kinds of the printed wiring boards are used as parts of the same machine (for example, it is intended to manufacture multiple kinds of printed wiring boards for a TV and a portable telephone), a predetermined manufacturing block is panelized for each printed wiring board (panelizing for different shapes) in order to obtain multiple kinds of the printed wiring boards from the same predetermined manufacturing block.

According to the above-described conventional technology, an art work film is created corresponding to the result of the panelizing. The art work film is expensive and requires much attention for storage. For this reason, the content of the panelizing in the predetermined manufacturing block has never been changed according to the manufacturing request for the printed wiring board.

Thus, if panelizing for the same shape is carried out in the predetermined manufacturing block, an art work film corresponding to that panelizing is created, and regardless of the quantity of boards requested to be manufactured, just printed wiring boards of a multiple of a number of those panelized are manufactured. For this reason, if the manufacturing quantity of the printed wiring boards cannot be divided evenly by the number of boards panelized in the predetermined manufacturing block according to the same shape, excessive printed wiring boards (called "incidental products") are generated. The generation of such incidental products is not favorable from the viewpoint of production costs and other costs for storage, for example.

In recent years, with the diversification of users, the kinds of the printed wiring boards have been increasing and the life cycles of the printed wiring boards have reduced rapidly. Thus, the production of printed wiring boards has been changing from the conventional production of few kinds in large quantity of each to the production of many kinds in small quantities of each. Accompanied by this trend, ultra-minority products, which are requested to be manufactured in extremely small quantities (1 or 2), have been generated. If, to manufacture this ultra-minority product, a single ultra-minority product is panelized in a predetermined manufacturing block, the amount of material which is removed and thrown away by cutting out that product increases, and this is not favorable from the viewpoint of production costs.

SUMMARY OF THE INVENTION

An object of the present invention is to provide a production system for printed wiring boards capable of suppressing the generation of incidental products and the waste of material as compared to the conventional manufacturing system.

The present invention applies the following structures to achieve the above object. That is, according to an aspect of the present invention, there is provided a manufacturing system for printed wiring boards comprising: a schedule data storage unit storing multiple manufacturing schedule data including the kind of printed wiring board scheduled to be manufactured and the manufacturing quantity thereof; a detecting unit detecting fractional printed wiring boards, which should be laid out in a single predetermined manufacturing block together with printed wiring boards of a different kind from the multiple kinds of the printed wiring boards scheduled to be manufactured according to multiple manufacturing schedule data; a condition data storage unit storing manufacturing condition data for laying out the printed wiring boards of different kinds in a single predetermined manufacturing block; a dividing unit dividing the detected fractional printed wiring boards into multiple groups according to the manufacturing condition data; and a determining unit determining the combination of the printed wiring boards of different kinds to be laid out in a single predetermined manufacturing block for each group.

The aforementioned detecting unit can, if the manufacturing quantity of the printed wiring boards of a certain kind cannot be divided completely by the maximum number of the printed wiring boards which can be laid out in a single predetermined manufacturing block, detect printed wiring boards corresponding to a number smaller than the maximum number or to an excess as printed wiring boards of the fraction.

The manufacturing condition data are, for example, data produced by combining a manufacturing request person's condition and a manufacturer's condition. The manufacturing request person's condition is, for example, shipment date. The manufacturer's condition is, for example, number of layers of the printed wiring boards.

The present invention may further comprise: a CAD data creating unit creating CAD data corresponding to a combination determined by the determining unit; and a CAD data converting unit for creating CAM data or CAT data corresponding to CAD data created by the CAD data creating unit. The present invention may still further comprise a manufacturing unit group carrying out the manufacturing process for the printed wiring boards, using the CAM data or CAT data created by the CAD data converting unit.

According to another aspect of the present invention, there is provided a manufacturing method for printed wiring boards comprising the steps of: reading multiple manufacturing schedule data including the kind of printed wiring board scheduled to be manufactured and the manufacturing quantity thereof; detecting the fractional printed wiring boards which should be laid out in a single predetermined manufacturing block together with the printed wiring boards of a different kind from the multiple kinds of the printed wiring boards scheduled to be manufactured, according to multiple manufacturing schedule data; reading manufacturing condition data for laying out the printed wiring boards of different kinds in a single predetermined manufacturing block; dividing the detected fraction printed wiring boards into multiple groups according to the manufacturing condition data; and determining a combination of the printed wiring boards of different kinds to be laid out in a single predetermined manufacturing block for each group.

According to still another aspect of the present invention, there is provided a computer-readable recording medium for recording a computer program for making a computer carry out the steps of: reading multiple manufacturing schedule data including the kind of printed wiring boards scheduled to be manufactured and the manufacturing quantity thereof; detecting the fractional printed wiring boards which should be laid out in a single predetermined manufacturing block together with printed wiring boards of a different kind from the multiple kinds of the printed wiring boards scheduled to be manufactured, according to multiple manufacturing schedule data; reading manufacturing condition data for laying out the printed wiring boards of different kinds in a single predetermined manufacturing block; dividing the detected fractional printed wiring boards into multiple groups according to the manufacturing condition data; and determining a combination of the printed wiring boards of different kinds to be laid out in a single predetermined manufacturing block for each group.

According to the manufacturing system for the printed wiring boards of the present invention, it is possible to suppress the generation of incidental products and the waste of material as compared to a conventional manufacturing system.

DESCRIPTION OF THE PREFERRED EMBODIMENTS

Hereinafter, the preferred embodiments of the present invention will be described with reference to the accompanying drawings.

[Manufacturing Process for Printed Wiring Board]

Figure 1:
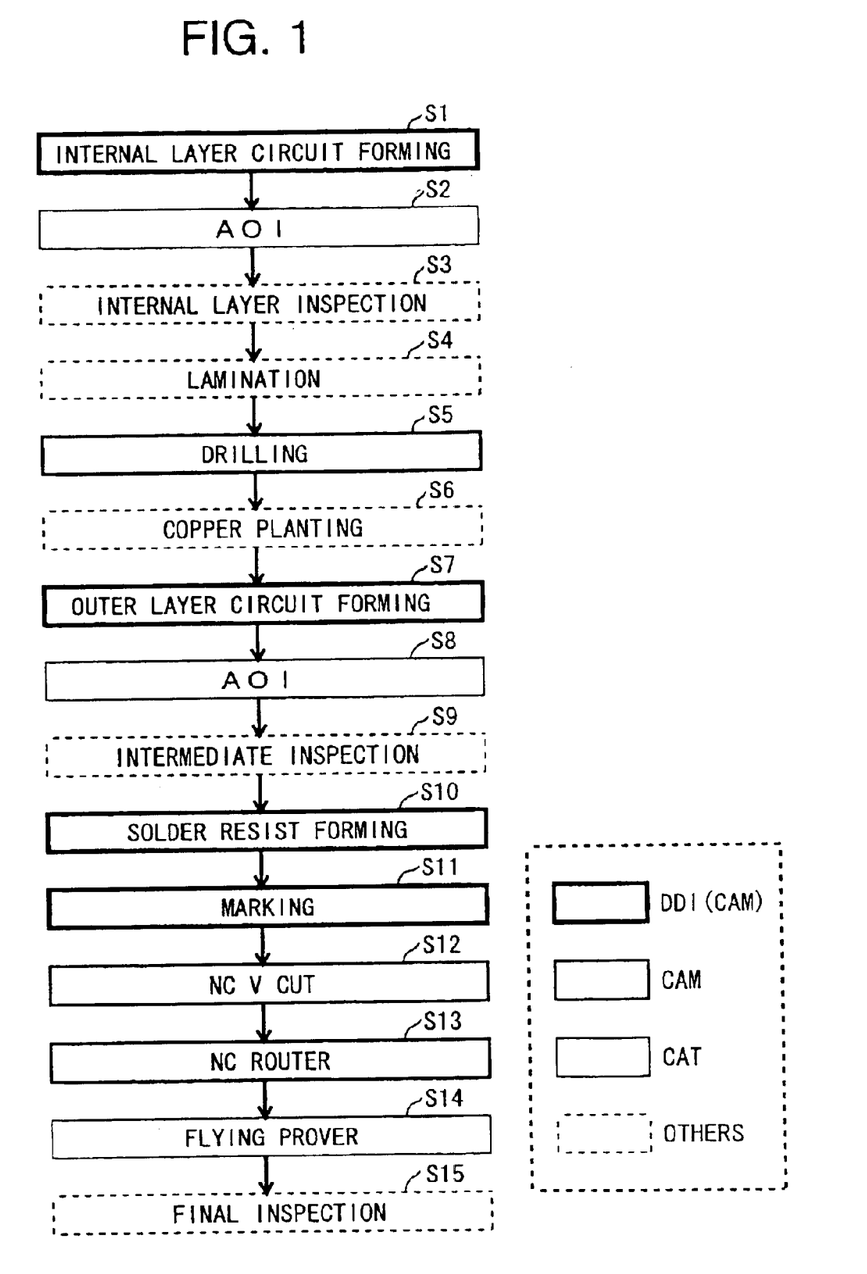
FIG. 1 is an explanatory diagram of a manufacturing process for printed wiring board.

First, the manufacturing process for the printed wiring boards according to the embodiment of the present invention will be described. FIG. 1 is an explanatory diagram showing an example of the manufacturing process for the printed wiring boards.

In the manufacturing process for the printed wiring boards, first of all, copper-clad laminate for an internal layer circuit (hereinafter referred to as a "substrate" or "board") is prepared. Next, a conductor pattern for the internal layer circuit is formed on this board (internal layer circuit forming process: step S1). Next, an inspection for short-circuits or breaks in wires in the internal layer circuit is carried out (auto optical inspection (AOI): step S2). Then, the internal inspection (step S3) is carried out.

Next, the boards in which the internal layer circuits are formed are combined and laminated (lamination process: step S4). Next, a through hole is formed in the laminated boards (drilling process: step S5). Next, the laminated boards are plated with copper and respective internal layer circuits are connected by the conductors (copper plating process: step S6). Next, a conductor pattern for an outer layer circuit is formed on a single surface or both surfaces of the laminated boards (outer layer circuit forming process: step S7). After that, AOI (step S8) and intermediate inspection (step S9) are carried out.

Next, a solder resist is formed on the surface of the laminated boards in which an outer layer circuit is formed (solder resist forming process: step S10). Next, marks, such as characters or symbols, are printed on the formed solder resist (marking process: step S11). After that, the laminated board is incised (NC V cut process: S12) and individual pieces are cut out from the laminated board along an outline of the printed wiring board (NC router process: step S13).

After that, a wire logic test (flying prover: step S14) is carried out and then, a final test (step S15) is executed. If the final test is cleared, a multi-layer printed wiring board is completed and shipped as a product.

According to this embodiment, in the above described internal layer circuit forming process (step S1) and the outer layer circuit forming process (step S7), photo-setting optical sensitive film is laminated on the board and a laser beam is irradiated on this optically sensitive film according to computer aided manufacturing (CAM) data indicating a conductor pattern so as to form an etching resist.

Further, in the solder resist forming process (step S10), in accordance with the CAM data indicating a pattern of the solder resist, a laser beam is irradiated onto the photo-hardening optically sensitive film so as to form a shielding mask. Then, the photo-hardening solder resist material coated on the laminated board is exposed using this shielding mask.

In the marking process (step S11), a laser beam is irradiated onto photo-hardening marking ink coated on the laminated board according to the CAM data, so that the marking ink corresponding to a place desired to leave is hardened.

As described above, in the manufacturing process of this embodiment, the use of the art work film is excluded from the internal layer circuit forming process (step S1), the outer layer circuit forming process (step S7), the solder resist forming process S10 and the marking process (step S11).

Meanwhile, an inventor of the present invention calls a method for drawing a conductor pattern, a solder resist pattern and a marking pattern for a circuit directly using the CAM data without using the art work film "DDI (data direct image)."

[Production System for Printed Wiring Board]

Figure 2:
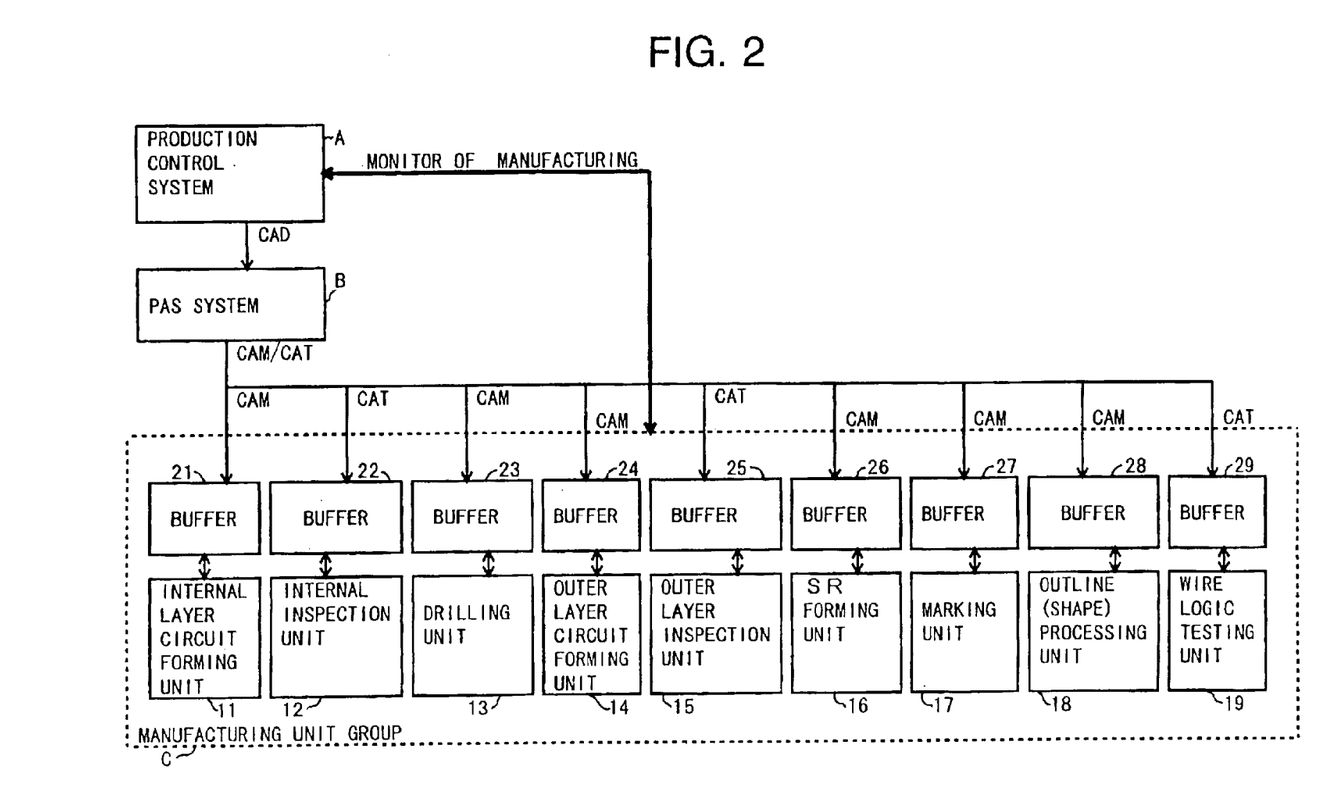
FIG. 2 is a configuration diagram of a manufacturing system for the printed wiring boards.

Next, a production system for carrying out the above manufacturing process for printed wiring boards will be described. FIG. 2 is an explanatory diagram of the production system. As shown in FIG. 2, the production system comprises production control system A, PAS system B and manufacturing unit group C.

Production Control System

Figure 3:
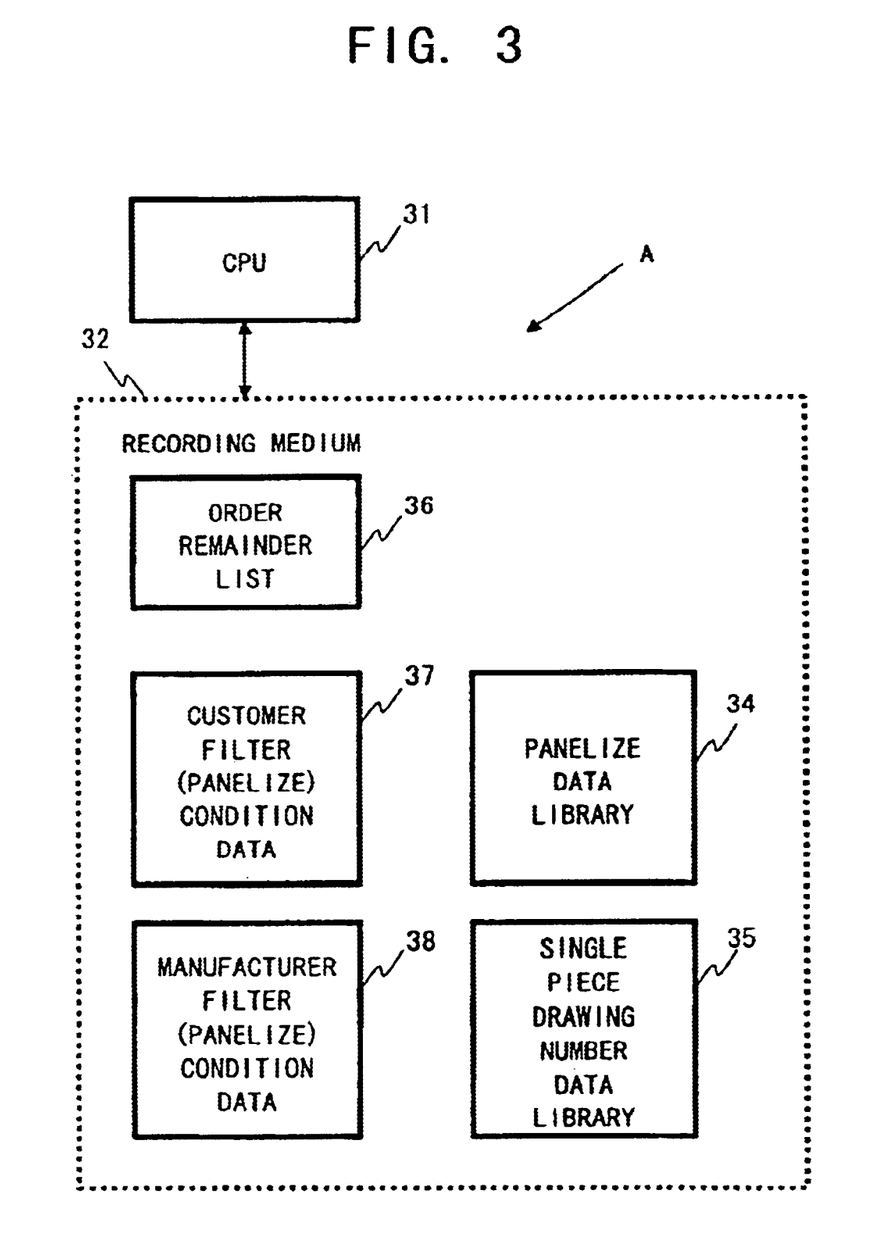
FIG. 3 is a partial configuration diagram of a production control system.

The production control system A is general-purpose computer such as work station. FIG. 3 is a block diagram showing major part of the production control system A. In FIG. 3, the production control system A comprises CPU 31 and recording medium 32. The CPU 31 realizes multiple functions by carrying out a production control program.

For example, the CPU 31 makes up a schedule for manufacturing the printed wiring boards and panelizing the final product with respect to the predetermined manufacturing block according to the result of this scheduling. Then, the CPU 31 controls the operations of the PAS system B and the manufacturing unit group C according to the result of the panelizing.

Further, the CPU 31 monitors the production condition at the manufacturing unit group C by receiving data (production condition data) concerning the production condition of respective apparatuses 11–19 of the manufacturing unit group C. By giving an instruction to the PAS system B according to this monitoring result, the CPU 31 controls the operations of the PAS system B and the manufacturing unit group C.

The recording medium 32 is comprised of a RAM, a hard disk, magnetic tape and the like. The recording medium 32 holds a production control program to be executed by the CPU 31 and is used as a working region of the CPU 31.

The recording medium 32 holds a panelizing drawing data library 34, a single piece drawing number data library 35, an order remainder list 36, customer filter (panelize) condition data 37, and manufacturer filter (panelize) condition data 38 as a data group used in the CPU 31.

Figure 11:
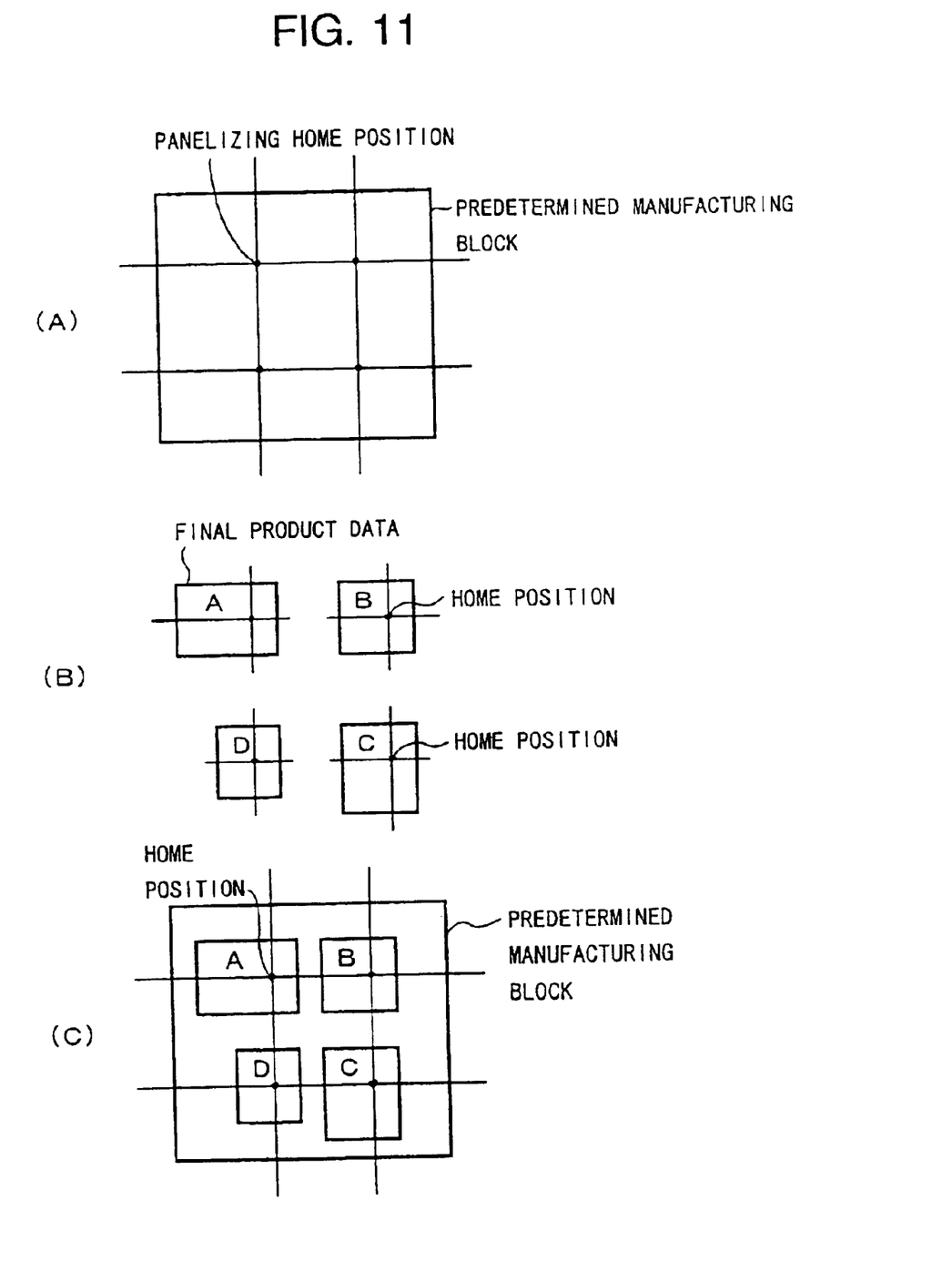
FIG. 11 is an explanatory diagram for disposing by a PAS system.

The panelizing data library 34 holds plural kinds of predetermined manufacturing data for the printed wiring boards and home position data (panelize home position data) for the final products of the printed wiring boards to be laid out in the predetermined manufacturing block (see FIG. 11(A)). The predetermined manufacturing block data is created corresponding to an outline of the internal layer circuit copper clad laminate as material for the printed wiring board.

The single piece drawing number data library 35 holds final product data for multiple kinds of printed wiring boards (see FIG. 11(B)). The final product data are graphic data indicating the configuration (layer structure including the number of layers, circuit pattern, solder resist pattern and the like) of the final product of the printed wiring boards. Drawing numbers are allocated to each final product data in order to specify the kind of the printed wiring boards and the CPU 31 controls the final product data using this drawing number.

Meanwhile, the panelizing drawing data and final product data are CAD data created by a CAD system (not shown) depending on the manufacturing request from the customer. The created CAD data is supplied by the CAD system to the production control system A and recorded in the recording medium 32.

Figure 4:
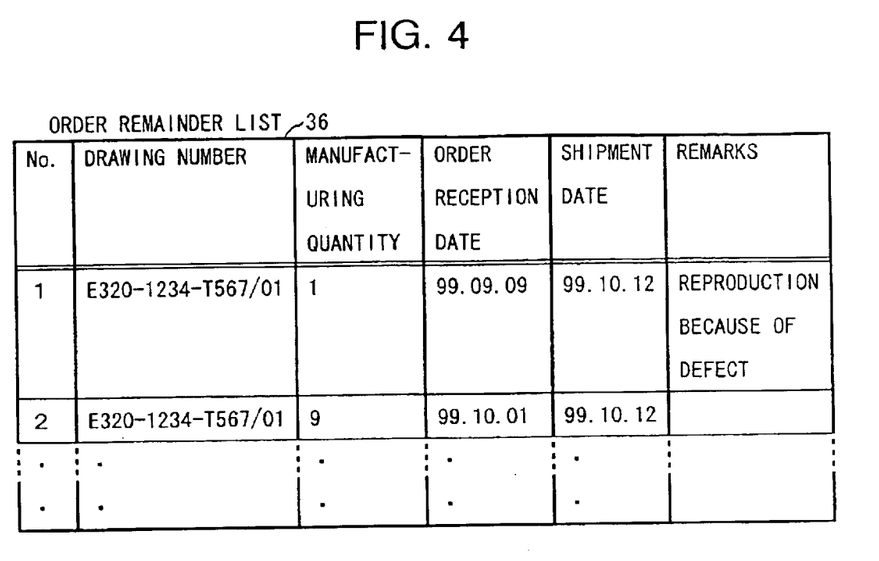
FIG. 4 is a diagram showing an example of an order remainder list.

FIG. 4 is an explanatory diagram showing an example of order remainder list 36. The order remainder list 36 stores multiple pieces of records comprising drawing number, production quantity, order reception date, shipment date and remarks regarding the printed wiring boards requested to be manufactured by the customer.

The record is stored each time when the printed wiring board is ordered, and if a final product is shipped to meet a request, a corresponding record is deleted from the order remainder list 36. If a defect is contained in the manufactured printed wiring board and the printed wiring board is produced newly, a record concerning that reproduced printed wiring board is stored. For example, a record of item 1 in FIG. 4 indicates a record concerning a printed wiring board to be reproduced.

Returning to FIG. 3, the customer filter condition data 37 refers to data indicating the customer condition for including a printed wiring board in a certain group, if multiple kinds of printed wiring boards to be panelized in different ways should be classified into multiple groups (grouping processing).

The customer filter conditions include, for example:
(1) shipment date; and
(2) parts to be mounted by customers (customer's handling date).

The customer filter conditions (1) and (2) are used independently or combined as required.

The manufacturer filter condition data 38 is data indicating the manufacturer's condition for incorporating a printed wiring board in one of predetermined groups when the grouping process about the printed wiring board is carried out.

The manufacturer filter conditions include, for example:
(1) the number of layers in the printed wiring board;
(2) a panelizing drawing (outline drawing);
(3) the presence or absence of Z0 (impedance control);
(4) a V cut;
(5) the drill diameter (inner diameter of through hole);
(6) the specification for destination;
(7) scaling;
(8) the presence or absence of solder coat; and
(9) the AOI condition.

According to this embodiment, an independent manufacturer filter condition is (1) the number of layers in the printed wiring board. Other conditions (2)–(9) are combined with condition (1) as required. For example, if it is intended to lay out multiple kinds of printed wiring boards having the same outline on a single predetermined manufacturing block, the above-described panelize drawing (outline drawing) (condition (2)) is incorporated into the manufacturer filter condition.

If the multiple kinds of the printed wiring boards to be manufactured are all single-layer printed wiring boards, the conditions (2)–(9) or a combination thereof are used as the manufacturer filter condition.

PAS system

Figure 5:
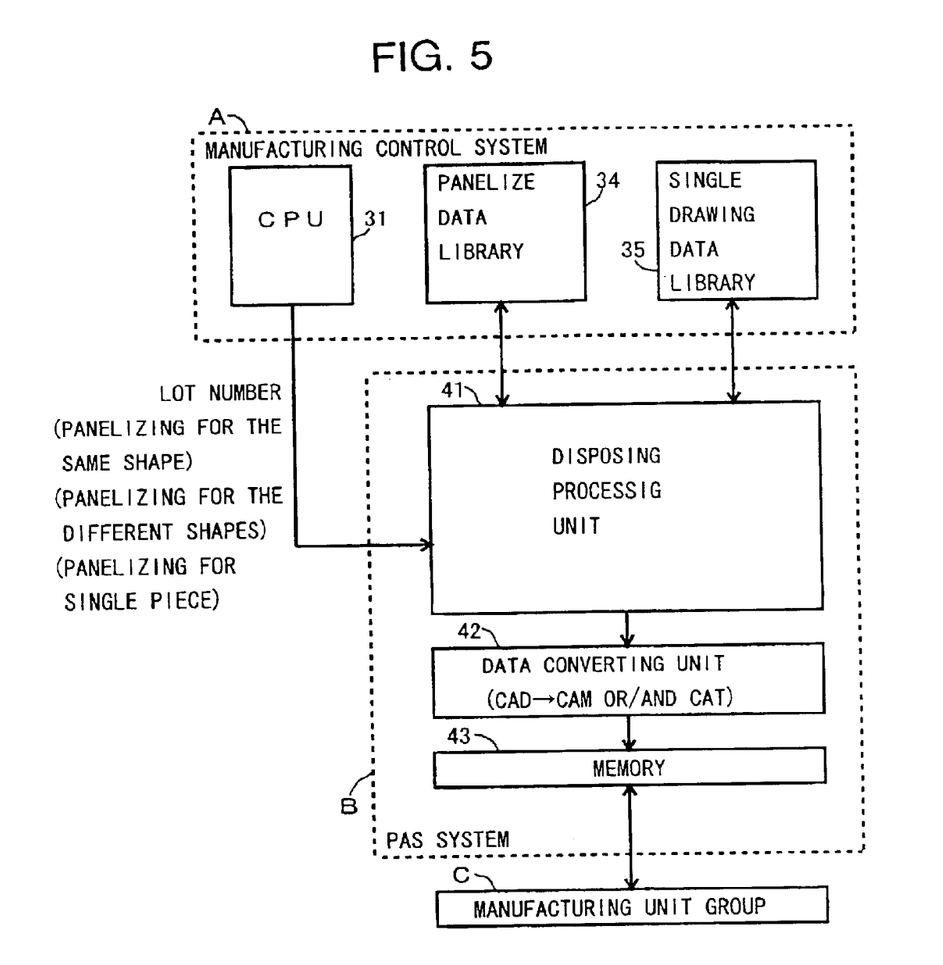
FIG. 5 is a functional block diagram of PAS system.

The PAS system B is a computer for generating computer aided manufacturing (CAM) data or computer aided testing (CAT) data from computer aided design (CAD) data concerning the printed wiring boards to be manufactured. FIG. 5 is a functional block diagram of the PAS system B, and the PAS system B comprises a disposing processing unit 41, a data converting unit 42 and a memory 43.

The disposing processing unit 41 disposes the final product data into the panelize data according to an instruction from the production control system A (CPU 31) (see FIG. 11(C)). The data converting unit 42 converts corresponding CAD data to CAM data or CAT data following the result of processing the disposing processing unit 41.

The memory 43 accumulates the CAM data and CAT data obtained by the disposing processing unit 41 and the data converting unit 42. The CAM data and CAT data accumulated in the memory 43 are supplied to the manufacturing unit group C according to an instruction from the production control system A or to a request from the manufacturing unit group C.

The disposing processing unit 41 and data converting unit 42 are functions which are achieved when a program is carried out by a CPU (not shown) composing the PAS system B.

Manufacturing Unit Group

Returning to FIG. 2, the manufacturing unit group C carries out the manufacturing process shown in FIG. 2 according to the CAD data, CAM data or CAT data supplied from the PAS system B. Meanwhile, FIG. 2 shows only manufacturing units which are operated based on the CAD data, CAM data or CAT data from the PAS system B.

More specifically, FIG. 2 shows an internal layer circuit forming unit 11 for carrying out an internal layer circuit forming process (step S1), an internal layer inspecting unit 12 for carrying out AOI (step S2), a drilling unit 13 for carrying out the drilling process (step S5), an outer layer circuit forming unit 14 for carrying out an outer layer circuit forming process (step S7) and an outer layer inspecting unit 15 for carrying out an AOI (step S8).

Further, FIG. 2 shows a solder resist (SR) forming unit 16 for carrying out a solder resist forming process (step S10), a marking unit 17 for carrying out a marking process (step S11), an outline processing unit 18 for carrying out an NCV cut process (step S12) and an NC router process (step S13) and a wire logic testing unit 19 for carrying out a flying prover (step S14).

Buffer memories 21–29 are provided between the respective units 11–19 and the PAS system B. The respective buffer memories 21–29 accumulate the CAM data and the CAT data supplied from the PAS system B.

[Processing by Production Control System]

Next, the processing by the production control system A will be described. The processing by the production control system A is achieved when the CPU 31 shown in FIG. 3 carries out the production control program recorded in the recording medium 32.

Figure 6:
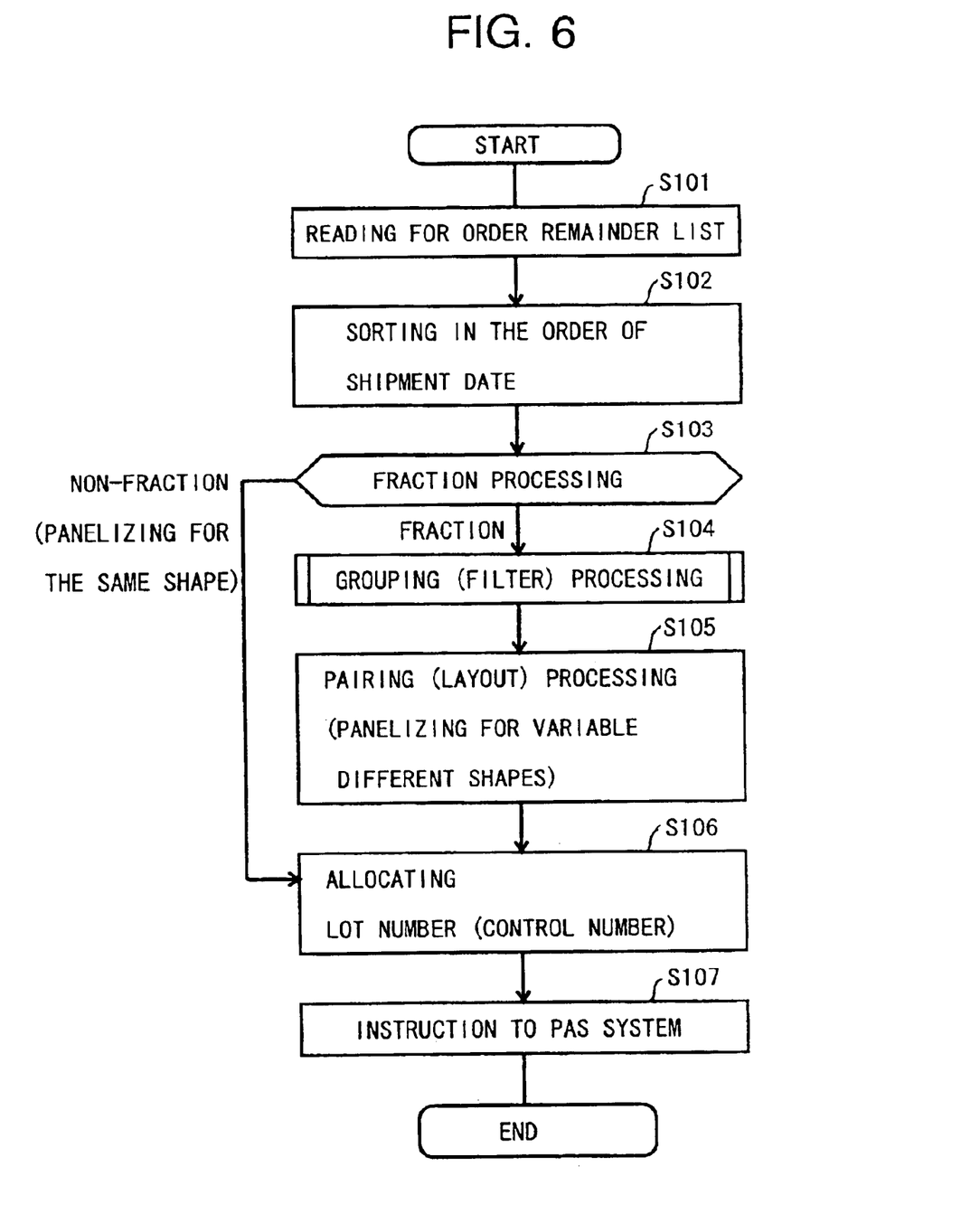
FIG. 6 is a flow chart showing processing by a production control system.

FIG. 6 is a flow chart showing the processing of the production control system A. The CPU 31 of the production control system A carries out the processing shown in FIG. 6 each time when a schedule for manufacturing the printed wiring board is made, for example.

First, the CPU 31 reads out the order remainder list 36 stored in the recording medium (not shown) (step S101). Next, the production control system A sorts multiple records stored in the order remainder list 36 in the order of shipment date (step S102).

Next, the CPU 31 carries out fraction processing (step S103). That is, the CPU 31 reads out panelizing drawing (predetermined manufacturing block) data corresponding to a desired drawing number from the panelize data library 34, and at the same time, reads out final product data corresponding to a desired drawing number from the single piece drawing number data library 35. Subsequently, the CPU 31 lays out the final product on a panelizing drawing according to the quantity for manufacturing.

Figure 7:
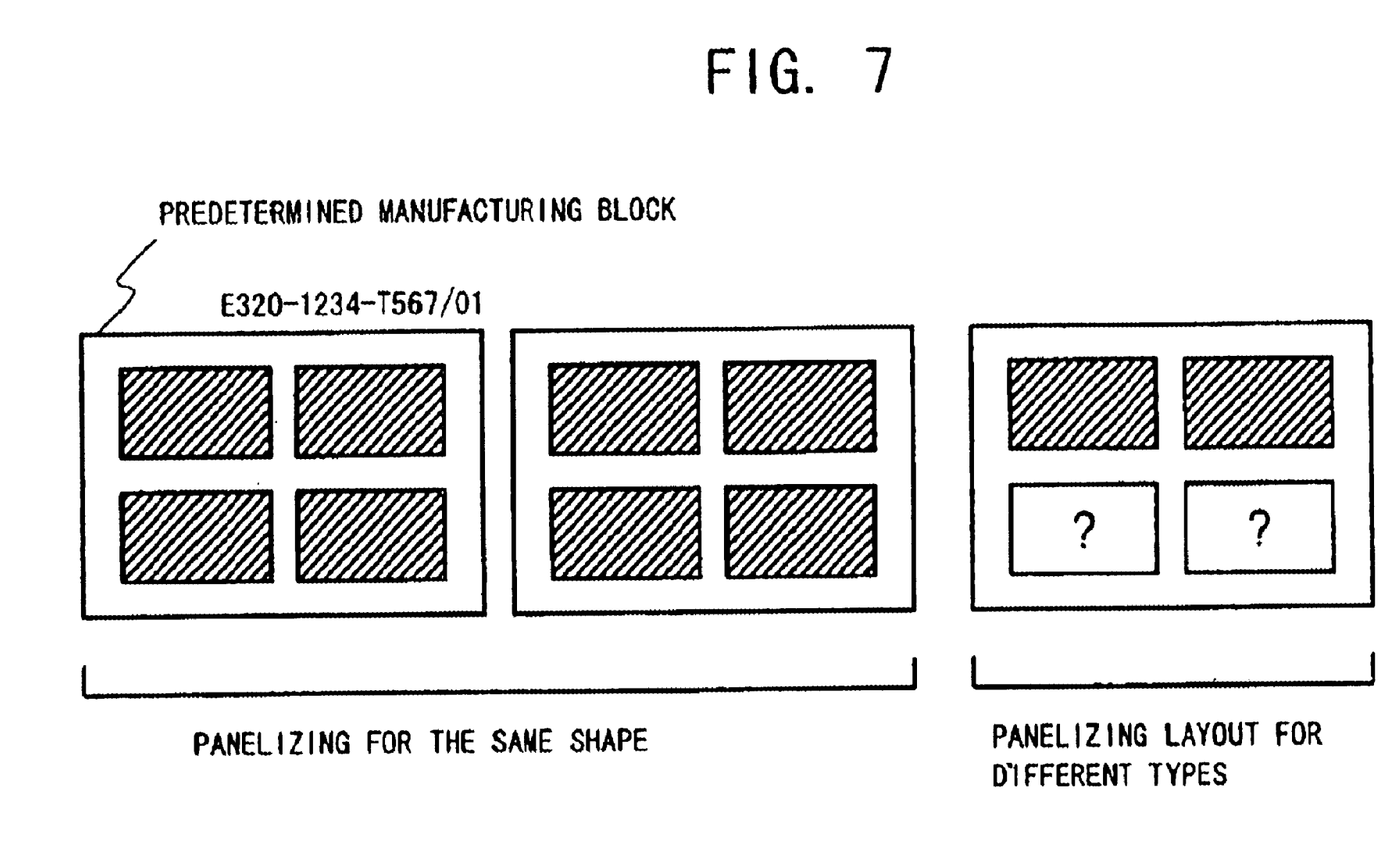
FIG. 7 is an explanatory diagram of fraction processing.

For example, if the fraction processing is carried out for the order remainder list 36 shown in FIG. 4, a panelizing drawing (predetermined manufacturing block) corresponds to a drawing number "E320-1234-T567/01." At this time, when four pieces of the final products having the drawing number "E320-1234-T567/01" can be laid out on the panelizing drawing, two, which is obtained as the remainder for a quantity of 10 of the drawing number "E320-1234-T567/01" (which is divided by 4), is the fraction as shown in FIG. 7.

As a result, of the 10 pieces of the drawing number "E320-1234-T567/01," eight pieces are determined to be manufactured according to the same panelizing, in which four pieces are to be created, and the processing proceeds to step S106. On the other hand, two pieces of drawing number "E320-1234-T567/01," as the fraction, are subjected to a grouping (filter) process at step S104.

The CPU 31 applies a remainder produced when the number for manufacturing is divided by a number of the pieces which can be panelized according to the same shape in the predetermined manufacturing block as a fraction. Thereby, the CPU 31 classifies printed wiring boards to be manufactured as fractional or non-fractional. Then, the non-fractional printed wiring boards are panelized as the same shape in the predetermined manufacturing block. Further, the CPU 31 handles printed wiring boards whose manufacturing quantity is smaller than a total number of pieces which can be panelized in a predetermined manufacturing block according to the same shape as fractions, also. Further, if the order remainder list 36 includes a record about ultra minority printed wiring boards, whose manufacturing quantity is 1 or 2, the CPU 31 handles those ultra-minority printed wiring boards as fractions.

Figure 8:
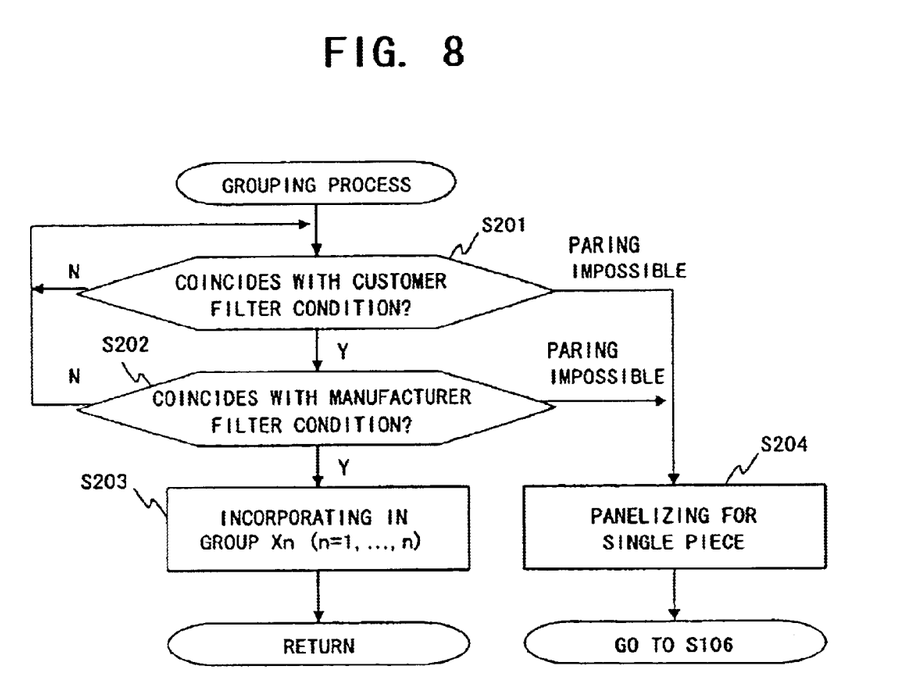
FIG. 8 is a flow chart showing grouping processing.
Figure 9:
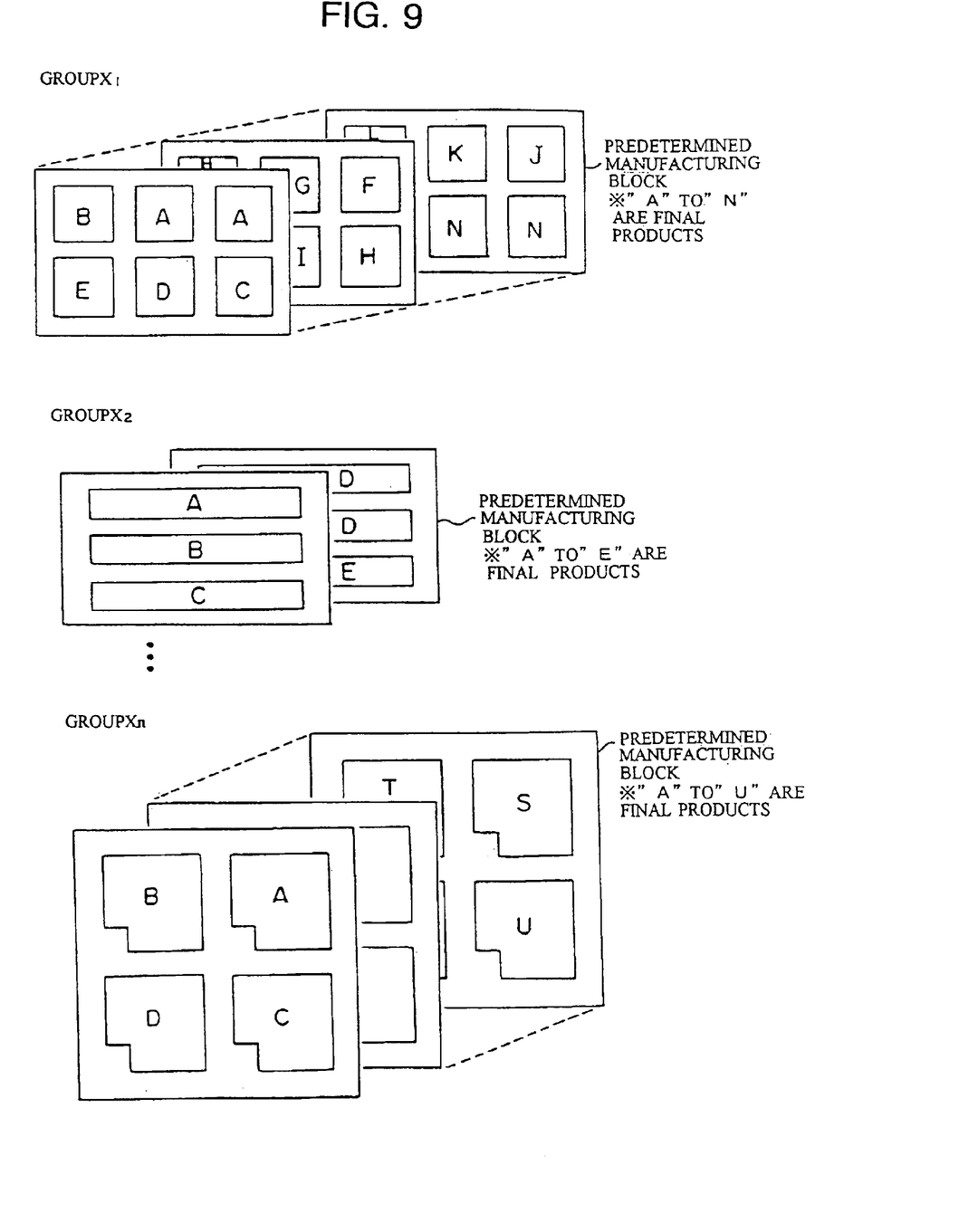
FIG. 9 is an explanatory diagram for pairing processing.

In step S104, the CPU 31 carries out a subroutine for grouping processing. FIG. 8 is a flow chart showing the sub-routine for grouping processing. As shown in FIG. 8, the CPU 31 includes a printed wiring board which satisfies the customer filter condition (YES in step S201) and satisfies the manufacturer filter condition (YES in step S202) in any of group Xn (n–1, 2, ..., n) (step S203). For example, the CPU 31 includes printed wiring boards having the same shipment date and m layers (m=1, 2, ..., m) in different groups.

On the contrary, if it is determined that a certain printed wiring board cannot be panelized together with the other printed wiring boards in the processing of steps S201 and S202 (pairing is impossible), the printed wiring board determined in such a way is not included in any group and then is panelized as a single piece in the predetermined manufacturing block (single-piece panelizing) and then, the processing proceeds to step S106.

If the grouping is completed for all the printed wiring boards determined to be fractions in this way, the subroutine of the grouping processing is finished, and then the processing proceeds to step S105.

In step S105, the CPU 31 carries out the pairing processing. That is, the CPU 31 lays out final product data for printed wiring boards grouped in step S104, belonging to each group X1, X2, ..., Xn in predetermined panelizing data. Consequently, as shown in FIG. 8, multiple kinds of the printed wiring boards are panelized in the predetermined manufacturing block.

In step S106, a lot number (management number) is allocated to all panelizing data in which panelizing for the same shape, panelizing for variable different shapes or panelizing for a single piece is carried out. The lot number contains the following information as absolutely necessary information:

a: predetermined sizes (size of outline, thickness);
    b: panelizing drawing number (definition of panelizing home position and the like);
    c: disposition of the final product on the panelizing drawing; and
    d: the key word for drawing number master access (the key word for accessing to the panelizing data library 34 and single-part drawing number data library 35).

According to this embodiment, multiple systems for the lot number are prepared depending on the panelizing method (panelizing for the same shape, panelizing for variable different shapes, or panelizing for a single piece) so that by recognizing the lot number, the panelizing method can be recognized.

In step S107, the CPU 31 supplies a lot number allocated to each predetermined manufacturing block to the PAS system B as a creation instruction for the CAM data/CAT data corresponding to a panelizing result.

In this way, each time when scheduling the manufacturing of printed wiring boards is carried out, the production control system A carries out fraction processing so as to detect a printed wiring board (including ultra-minority products) corresponding to the fraction. After that, panelizing for different shapes is carried out for the printed wiring board corresponding to the fraction by grouping processing and pairing processing.

The content (pairing) for this panelizing for different shapes changes depending on the content of the order remainder list 36 for use in scheduling. Thus, the inventor of the present invention calls the method for panelizing for different shapes "panelizing for variable different shapes."

[Processing by PAS System]

Next, the processing by the PAS system B will be described with reference to FIG. 5. The disposing processing unit 41 of the PAS system B receives lot numbers corresponding to the panelizing data from the production control system A as an instruction for disposition. Then, the PAS system B carries out processing following the flow chart of FIG. 10.

Figure 10:
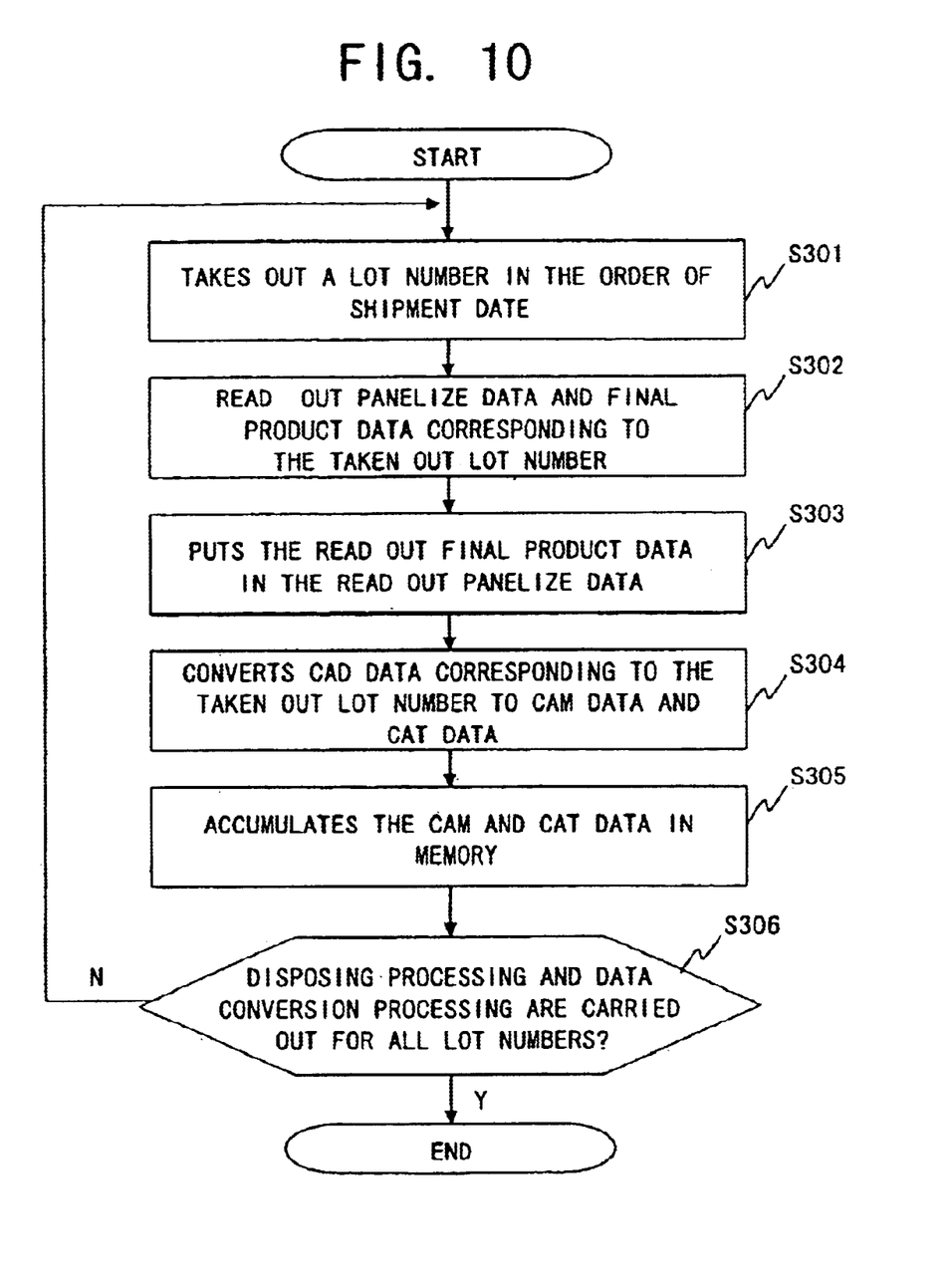
FIG. 10 is a flowchart showing processing by a PAS system.

That is, the disposing processing unit 41 of the PAS system B picks out a lot number in the order of shipment date (step S301). Subsequently, the disposing processing unit 41 accesses the panelizing data library 34 and single piece drawing number data library 35 using a key word contained in the lot number so as to read out panelizing data and final product data corresponding to that lot number (step S302).

For example, if the lot number corresponds to panelizing data for panelizing for variable different shapes, panelizing data corresponding to this lot number (see FIG. 11(A)) and final product data (see FIG. 11(B)) about multiple kinds of printed wiring boards, which are to be panelized in this panelizing drawing (predetermined manufacturing block) according to different shapes, are read out.

Next, the disposing processing unit 41 puts each final product data in the panelizing data (step S303). At this time, each final product data is laid out in such a condition that a home position thereof coincides with a panelizing home position set up in the panelizing data (see FIG. 11(C)). Consequently, CAD data corresponding to the lot number are created.

Next, the data converting unit 42 receives the CAD data from the disposing processing unit 41 and converts these CAD data to CAM data or CAT data (step S304). That is, the CAM data and CAT data for use in each process of the manufacturing unit group C are produced from the CAD data.

After that, the data converting unit 42 produces the CAM data and CAT data corresponding to a lot number and accumulates the CAM data and CAT data in the memory 43 (step S305).

After that, whether or not all lot numbers received from the production control system A are subjected to processing by the disposing processing unit 41 and data converting unit 42 is determined (step S306). At this time, if the processing is not carried out, the processing is returned to step S301, and if the processing is carried out, the processing by the PAS system B shown in FIG. 11 is terminated.

In this manner, the CAM data and CAT data about lot numbers corresponding to panelizing for the same shape, panelizing for variable different shapes and panelizing for a single piece are created and then accumulated in the memory 43.

[Processing by Manufacturing Unit Group]

Next, processing and operation of the respective apparatuses 21–29 of the manufacturing unit group C will be described.

Internal Layer Circuit Forming Unit

A buffer 21 of the internal layer circuit forming unit 11 accumulates at least one of CAM data for forming an internal layer circuit, which is held by the memory 43 of the PAS system B, and a lot number corresponding to each of the CAM data. Each of the CAM data includes data about conductor patterns in the internal layer circuit.

For example, if a board coated with photo-setting optically sensitive film is disposed at a predetermined position through a manufacturing line, the internal layer circuit forming unit 11 detects a lot number attached to the board. The internal layer circuit forming unit 11 reads out the CAM data corresponding to the detected lot number from the buffer 21. Then, the internal layer circuit forming unit 11 irradiates the optically sensitive film with a laser beam by raster scanning or vector scanning according to the read out CAM data so as to draw a conductor pattern for the internal layer circuit.

As a result, if a portion of the optically sensitive film irradiated with the laser beam is hardened and then developed, only the hardened portion (positive pattern) is left. The remaining portion is used as an etching resist. After that, patterning material is etched according to the etching resist and then, the etching resist is removed. In this way, a conductor pattern for the internal layer circuit is formed.

Internal Layer Inspecting Unit

A buffer 22 of the internal layer inspecting unit 12 accumulates at least one of CAT data for inspecting an internal layer circuit, which is held by the memory 43 of the PAS system B, and a lot number corresponding to each of the CAT data. Each of the CAT data includes data for a conductor pattern formed in the internal layer circuit forming process in the step S1.

For example, if a board passing the internal layer circuit process (step S1) is transported through the manufacturing line, the internal layer inspecting unit 12 detects a lot number attached to the board. After that, the internal layer inspecting unit 12 scans a conductor pattern of the board, reads out the CAT data corresponding to the detected lot number from the buffer 22 and carries out pattern matching. Thereby, inspection for breaks or short-circuits of the internal layer circuit is carried out.

Drilling Unit

A buffer 23 of the drilling unit 13 accumulates at least one of CAM data for drilling held by the memory 43 of the PAS system B and a lot number corresponding to each of the CAM data. Each of the CAM data includes data regarding drilling position for a through hole in the board and drill diameter.

For example, if a board (laminated board) passing the lamination process (step S4) of the manufacturing line is disposed at a predetermined position, the drilling unit 13 detects a lot number attached to the laminated board. The drilling unit 13 reads out the CAM data corresponding to the detected lot number from the buffer 23. After that, the drilling unit 13 forms at least one of through holes having a predetermined diameter at a predetermined position of the board according to the read out CAM data.

Outer Layer Circuit Forming Unit

A buffer 24 of the internal layer circuit forming unit 14 accumulates at least one of CAM data for forming an outer layer circuit, which is held by the memory 43 of the PAS system B, and a lot number corresponding to each of the CAM data. Each of the CAM data includes data regarding a conductor pattern of the outer layer circuit.

The outer layer circuit forming unit 14 forms an etching resist according to the same method that the internal layer circuit forming unit 11 uses. After that, etching is carried out according to the etching resist and the etching resist is removed so as to form the conductor pattern of the outer layer circuit.

Outer Layer Inspecting Unit

A buffer 25 of the outer layer inspecting unit 15 accumulates at least one of CAT data for inspecting an outer layer circuit, which is held by the memory 43 of the PAS system B, and a lot number corresponding to each of the CAT data. Each of the CAT data includes data regarding conductor patterns formed in the outer layer circuit forming process in step S7.

When a laminated board in which the outer layer circuit is formed is transported through the manufacturing line, the outer layer inspecting unit 15 detects a lot number attached to the laminated board. The outer layer inspecting unit 15 carries out pattern matching by scanning the conductor pattern of the outer layer circuit and reading out the CAT data corresponding to the detected lot number from the buffer 25. Consequently, inspection for breaking or short-circuits of the outer layer circuit is carried out.

Solder Resist (SR) Forming Unit

A buffer 26 of the SR forming unit 16 accumulates at least one of CAM data for forming the solder resist, which is held by the memory 43 of the PAS system B, and a lot number corresponding to each of the CAM data. Each of the CAM data includes data regarding solder resist pattern covering the outer layer circuit.

When a laminated board passing the outer layer inspection is transported through the manufacturing line, the SR forming unit 16 detects a lot number attached to the board and covers the surface of the laminated board with photosetting optically sensitive film. Subsequently, the SR forming unit 16 reads out the CAM data corresponding to the detected lot number from the buffer 26 and irradiates with a laser beam according to the read out CAM data (for drawing a SR pattern).

Then, a portion irradiated with a laser beam of the optically sensitive film is hardened and made able to absorb ultraviolet rays. Using this optically sensitive film as a shielding mask, the laminated board coated with ultraviolet curing SR material on the surface is subjected to ultraviolet ray exposure processing. Then, a portion of the SR material irradiated with ultraviolet rays is hardened and, if developed, only the portion irradiated with ultraviolet rays is left. In this manner, the solder resist is formed.

Marking Unit

A buffer 27 of the marking unit 17 accumulates at least one of CAM data for marking, which is held by the memory 43 of the PAS system B, and a lot number corresponding to each of the CAM data. Each of the CAM data includes data corresponding to a pattern (a marking pattern) of characters and symbols printed on a laminated board by marking.

When a laminated board passing the SR forming process (step S10) is transported through the manufacturing line, the marking unit 27 detects a lot number attached to the transported laminated board. Subsequently, the marking unit 27 coats a predetermined position on the surface of the laminated board with photo-setting marking ink, reads out the CAM data corresponding to the detected lot number from the buffer 27 and irradiates it with a laser beam according to the CAM data (for drawing a marking pattern). Then, the portion of the marking ink irradiated with the laser beam is hardened. After that, if developing processing is carried out, only the portion irradiated with laser beam is left, so that marking on the laminated board is completed.

Outline Processing Unit

The outline processing unit 18 contains a V cut unit and router. A buffer 28 of the outline processing unit 18 accumulates V cut data held by the memory 43, CAM data for cutting individual pieces by the router and lot numbers corresponding to these. The CAM data includes XY coordinate data indicating a V cut position relative to the laminated board and XY coordinate data indicating a cutting position relative to the laminated board.

If a laminated board is disposed at a predetermined position through the manufacturing line, the V cut unit reads out CAM data corresponding to the lot number attached to the laminated board from the buffer 28 and incises the laminated board according to these CAM data. Consequently, cutting lines are made in the final product to separate it into multiple individual pieces as required by the customer.

If a laminated board is disposed at a predetermined position through the manufacturing, line, CAM data corresponding to a lot number attached to the laminated board are read out from the buffer 28 and a single piece or multiple pieces are cut out from the laminated board according to these CAM data. Consequently, a single piece or multiple pieces of laminated boards having an outline of its final product are obtained.

Wire Logic Testing Unit

A buffer 29 of the wire logic testing unit 19 accumulates CAT data for a flying prover (step S14) held by the memory 43 and corresponding to a lot number. The CAT data includes wire logic master data, open/short check data and the like.

If individual pieces cut out by the router are transported through the manufacturing line, the lot numbers attached to the individual pieces are detected in the wire logic testing unit 19 and CAT data corresponding to each lot number are read out from the buffer 29 and a wire logic test for each of the individual pieces is carried out according to the CAT data.

[Operation of Production System]

Next, an example of the operation of the entire production system for the printed wiring board will be described.

First Example of Operation

If a start instruction for manufacturing is inputted into the production control system A, the processing shown in FIG. 6 is carried out by the production control system A. Consequently, panelizing data (panelizing for the same kind, panelizing for variable different shapes, panelizing for single piece) are prepared corresponding to the content of the order remainder list 36 and then, a lot number is allocated to each of the panelizing data.

After that, if each lot number is supplied to the PAS system B, the PAS system B creates the CAM data and CAT data corresponding to each lot number and accumulates them in the memory 43.

After that, the PAS system B accumulates the CAM data and CAT data corresponding to a certain lot number in the respective buffers 21–29 of the manufacturing unit group C according to a predetermined manufacturing order.

As a result, the respective apparatuses 11–19 come to store the CAM data and CAT data corresponding to the printed wiring board before the manufacturing process for the printed wiring board is started.

After that, when a board (a laminated board or individual pieces) provided with a lot number is transported through the manufacturing line, the respective units 11–19 of the manufacturing unit group C read out the CAM data and CAT data corresponding to that lot number from the buffer and carry out each process using the read out CAM data or CAT data.

Each of units 11–19, unless corresponding CAM data or CAT data are accumulated in the buffer at this time, requests to add the corresponding data to the PAS system B. The PAS system B supplies the corresponding data to corresponding buffer to meet the request.

After that, the CAM data and CAT data accumulated in the memory 43 and buffers 21–29 are deleted when a process using the CAT data or CAM data is terminated or the entire process corresponding to a lot number is terminated. A deletion timing for the CAM data and CAT data held by the memory 43 and buffers 21–29 can be set up appropriately by a manager of the production system.

Second Example of Operation

The second example of operation is the same as the first example of operation until CAM/CAT data corresponding to a lot number are accumulated in the memory 43 of the PAS system B. After that, CAM data corresponding to a certain lot number are supplied to the internal layer circuit forming unit 11 (buffer 21) so as to carry out the internal layer circuit forming process s1.

At this time, the production control system A monitors the formation of the internal layer circuit by the internal layer circuit forming unit 11. Before a board in which the internal layer circuit is formed first reaches the internal layer inspecting unit 12 through the manufacturing line, the CAT data for internal layer inspection corresponding to the corresponding lot number are accumulated in the buffer 22. If the board reaches the internal layer inspecting unit 12, internal layer inspection is carried out using the CAT data accumulated in the buffer 22.

In this manner, the production control system A monitors the process of each of apparatuses 11–19 of the manufacturing unit group C and supplies the corresponding CAM data and CAT data to a buffer of an apparatus corresponding to next process before material passing a certain process reaches next process.

At this time, when the production control system A gives an instruction to the PAS system B, the corresponding CAM data and CAT data are supplied from the memory 43 to the buffer. The units corresponding to the buffer may hold the CAM data or CAT data or alternatively, a processing unit or inspection unit of the manufacturing unit group C may request the PAS system B to supply the corresponding CAM data or CAT data and receive that supply according to the instruction from the production control system A.

Although in the above described example of operation, the processing shown in FIG. 6 is carried out when a start instruction for manufacturing is inputted into the production control system A, the start timing of the processing of FIG. 6 can be set up appropriately by a manager of the production system.

[Operation of the Embodiment]

According to the embodiment of the present invention, the production control system A carries out the processing shown in FIG. 6 at a predetermined timing (when the manufacturing process of each day starts) to divide the printed wiring boards scheduled to be manufactured at that point in time into non-fractional and fractional categories.

Then, the non-fractional printed wiring boards are panelized in groups of the same shape and the fractional printed wiring boards are grouped depending on manufacturing conditions thereof (customer filter condition and manufacturer filter condition), so that the printed wiring boards belonging to each group are panelized (pairing) in groups of different shapes in a predetermined manufacturing block.

Consequently, panelizing of the printed wiring boards is carried out without the generation of an incidental product. Therefore, wastes due to the generation of incidental products can be prevented. Further, because the ultra-minority products are treated as a fractional printed wiring board and panelized in groups of different shapes, it is possible to suppress the generation of such an incidental product or waste of material accompanied by the production of the ultra minority products.

What is claimed is:

1. A manufacturing system for manufacturing printed wiring boards of plural types, said printed wiring boards scheduled to be manufactured are laid out on at least one predetermined manufacturing block, comprising:

a schedule data storage unit storing manufacturing schedule data including printed wiring board data, each type of the printed wiring boards and a number of each of the printed wiring boards scheduled to be manufactured;

a detecting unit detecting a plurality of fractional printed wiring boards, said fractional printed wiring board to be laid out to a format of a single predetermined manufacturing block together with a plurality of printed wiring boards having a different type within the printed wiring boards scheduled to be manufactured based on the manufacturing schedule data stored in said schedule data storage unit, printed wiring board data, and predetermined manufacturing block data, said detecting unit being embodied in a CPU and a recording medium, said recording medium including a single piece drawing number data library storing said printed wiring board data and a panelizing data library storing said predetermined manufacturing block data, said detecting being carried out as follows:

(1) said predetermined manufacturing block data are read out from said recording medium;

(2) data of a certain type of ordered printed wiring board are read out from the recording medium; and (3) printed wiring boards are virtually laid out on the predetermined manufacturing block according to the quantity ordered;

wherein processes (1)–(3) are carried out for each type of ordered printed wiring board;
  a condition data storage unit storing manufacturing condition data for laying out printed wiring boards of the plural types on a format of a single predetermined manufacturing block;
  a grouping unit grouping each of the fractional printed wiring boards detected by said detecting unit into any of a number of groups according to the manufacturing condition data stored in said condition data storage unit; and
  a determining unit determining, per group, layout to the at least one predetermined manufacturing block of the fractional printed wiring board.

2. A manufacturing system according to claim 1, wherein said detecting unit, if the number of printed wiring boards of a certain type scheduled to be manufactured cannot be divided completely by the maximum number of the printed wiring boards which can be laid out in a single predetermined manufacturing block, detects each printed wiring board corresponding to the number smaller than the maximum number or each printed wiring board corresponding to the remainder of the division as the fractional printed wiring board.

3. A manufacturing system according to claim 1, wherein the manufacturing condition data is data produced by combining manufacturing request person's condition and manufacturer's condition.

4. A manufacturing system according to claim 3, wherein the manufacturing request person's condition is shipment date.

5. A manufacturing system according to claim 3, wherein the manufacturer's condition is number of layers of the printed wiring boards.

6. A manufacturing system according to claim 4, wherein the manufacturer's condition is number of layers of the printed wiring boards.

7. A manufacturing system according to claim 1 further comprising:
  a CAD data creating unit creating CAD data corresponding to a combination determined by said determining unit; and
  a CAD data converting unit creating CAM data or CAT data corresponding to CAD data created by said CAD data creating unit.

8. A manufacturing system according to claim 7 further comprising:
  manufacturing unit group carrying out manufacturing process for the printed wiring board using the CAM data or CAT data created by said CAD data converting unit.

9. A manufacturing method for manufacturing printed wiring boards of plural types, said printed wiring boards scheduled to be manufactured are laid out to at least one predetermined manufacturing block, comprising:
  reading manufacturing schedule data including printed wiring board data, each of the plural types of the printed wiring boards and a number of each of the printed wiring boards scheduled to be manufactured;
  detecting a plurality of fractional printed wiring boards, said fractional printed wiring boards to be laid out to a format of a single predetermined manufacturing block together with a plurality of printed wiring boards having a different type within the printed wiring boards scheduled to be manufactured based on the manufacturing schedule data, printed wiring board data, and predetermined manufacturing block data said detecting of fractional printed wiring boards being carried out by using a CPU and a recording medium, said recording medium including a single piece drawing number data library storing said printed wiring board data and a panelizing data library storing said predetermined manufacturing block data, said detecting further being carried out as follows:
  (1) said predetermined manufacturing block data are read out from said recording medium;
  (2) data of a certain type of ordered printed wiring board are read out from the recording medium; and
  (3) printed wiring boards are virtually laid out on the predetermined manufacturing block according to the quantity ordered;
wherein processes (1)–(3) are carried out for each type of ordered printed wiring board;
  reading a manufacturing condition data for laying out printed wiring boards of the plural types on a format of a single predetermined manufacturing block;
  grouping each of the detected fractional printed wiring boards into any of a number of groups according to the manufacturing condition data; and
  determining, per group, layout to the at least one predetermined manufacturing block of the fractional printed wiring board.

10. A computer-readable recording medium for recording a computer program for making a computer to carry out processes for manufacturing printed wiring boards of plural types, said printed wiring boards scheduled to be manufactured are laid out to at least one predetermined manufacturing block, the program comprising:
  reading manufacturing schedule data including printed wiring board data, each of the plural types of the printed wiring boards and a number of each of the printed wiring boards scheduled to be manufactured;
  detecting a plurality of fractional printed wiring boards, said fractional printed wiring boards to be laid out to a format of a single predetermined manufacturing block together with a plurality of printed wiring boards having a different type within the printed wiring boards scheduled to be manufactured based on the multiple manufacturing schedule data, printed wiring board data, and predetermined manufacturing block data, said detecting of fractional printed wiring boards being carried out by using a CPU and a recording medium, said recording medium including a single piece drawing number data library storing said printed wiring board data and a panelizing data library storing said predetermined manufacturing block data, said detecting further being carried out as follows:
  (1) said predetermined manufacturing block data are read out from said recording medium;
  (2) data of a certain type of ordered printed wiring board are read out from the recording medium; and
  (3) printed wiring boards are virtually laid out on the predetermined manufacturing block according to the quantity ordered;
wherein processes (1)–(3) are carried out for each type of ordered printed wiring board;
  reading manufacturing condition data for laying out printed wiring boards of the plural types to a format of a single predetermined manufacturing block;
  grouping each of the detected fractional printed wiring boards into any of a number of groups according to the manufacturing condition data; and
  determining, per group, layout to the at least one predetermined manufacturing block of the fractional printed wiring board.

* * * * *